(12) United States Patent
Lin et al.

(10) Patent No.: US 11,309,296 B2
(45) Date of Patent: Apr. 19, 2022

(54) SEMICONDUCTOR PACKAGE AND MANUFACTURING METHOD THEREOF

(71) Applicant: Powertech Technology Inc., Hsinchu County (TW)

(72) Inventors: Nan-Chun Lin, Hsinchu County (TW); Hung-Hsin Hsu, Hsinchu County (TW); Shang-Yu Chang Chien, Hsinchu County (TW); Wen-Hsiung Chang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 114 days.

(21) Appl. No.: 16/687,713

(22) Filed: Nov. 19, 2019

(65) Prior Publication Data

US 2020/0091126 A1 Mar. 19, 2020

Related U.S. Application Data

(63) Continuation-in-part of application No. 15/715,169, filed on Sep. 26, 2017, now abandoned.

(51) Int. Cl.
*H01L 25/16* (2006.01)
*H01L 23/48* (2006.01)
(Continued)

(52) U.S. Cl.
CPC ........ *H01L 25/167* (2013.01); *H01L 21/4857* (2013.01); *H01L 21/561* (2013.01);
(Continued)

(58) Field of Classification Search
CPC ......... H01L 25/18; H01L 24/17; H01L 24/05; H01L 24/03; H01L 24/73; H01L 24/32;
(Continued)

(56) References Cited

U.S. PATENT DOCUMENTS 9,396,998 B2 7/2016 Kurita et al.
2009/0059055 A1* 3/2009 Nakano ............ H01L 27/14618
348/340

(Continued)

FOREIGN PATENT DOCUMENTS

TW 201916276 4/2019
TW 201935673 9/2019

OTHER PUBLICATIONS

Office Action of Taiwan Counterpart Application, dated Feb. 4, 2021, pp. 1-7.

*Primary Examiner* — Marcos D. Pizarro
(74) *Attorney, Agent, or Firm* — JCIPRNET

(57) ABSTRACT

A semiconductor package including a plurality of first chips, a plurality of through silicon vias, a least one insulator, a first circuit structure and a first encapsulant is provided. The first chip electrically connected to the through silicon vias includes a sensing area on a first active surface, a first back surface and a plurality of through holes extending from the first back surface towards the first active surface. The insulator is disposed on the first active surfaces of the first chips. The first circuit structure disposed on the first back surfaces of the first chips and electrically connected to the through silicon vias. The first encapsulant, laterally encapsulating the first chips.

13 Claims, 27 Drawing Sheets

(51) Int. Cl.
    *H01L 21/56*    (2006.01)
    *H01L 21/768*   (2006.01)
    *H01L 21/48*    (2006.01)
    *H01L 23/498*   (2006.01)
    *H01L 23/00*    (2006.01)
    *H01L 23/538*   (2006.01)
    *H01L 23/31*    (2006.01)
    *H01L 25/04*    (2014.01)
    *H01L 25/065*   (2006.01)

(52) U.S. Cl.
    CPC .... *H01L 21/76898* (2013.01); *H01L 23/3121* (2013.01); *H01L 23/481* (2013.01); *H01L 23/49816* (2013.01); *H01L 23/5389* (2013.01); *H01L 24/96* (2013.01); *H01L 24/97* (2013.01); *H01L 25/042* (2013.01); *H01L 25/0655* (2013.01); *H01L 2224/16221* (2013.01)

(58) Field of Classification Search
    CPC ... H01L 24/96; H01L 21/76871; H01L 24/16; H01L 25/50; H01L 23/3135; H01L 23/481; H01L 21/76846; H01L 21/76898; H01L 2924/01073; H01L 2924/01029; H01L 2924/01022; H01L 2224/73204; H01L 2224/32145; H01L 2224/32137; H01L 2224/95001; H01L 2224/17181; H01L 2224/05009; H01L 2224/16141; H01L 27/144; H01L 25/0655; H01L 23/3171; H01L 23/53252; H01L 23/53238; H01L 21/568; H01L 21/561; H01L 2224/05008; H01L 2224/0391; H01L 2224/0362; H01L 2224/0239; H01L 2224/02371; H01L 2224/02381; H01L 2224/02379; H01L 2224/02372; H01L 2924/12043; H01L 2924/13056; H01L 2924/01047; H01L 2924/01028; H01L 2224/05022; H01L 2224/16145; H01L 25/167; H01L 21/4857; H01L 23/49816; H01L 2224/05181; H01L 2224/05166; H01L 2224/05655; H01L 2224/2919; H01L 2224/05647; H01L 2224/05155; H01L 2224/131; H01L 2224/05147; H01L 2224/05144; H01L 2224/05644; H01L 2225/06548; H01L 2225/06513; H01L 25/03; H01L 2225/06524; H01L 2225/06527; H01L 2225/06541; H01L 25/0652; H01L 24/13; H01L 2224/18; H01L 24/92; H01L 24/11; H01L 24/19; H01L 24/20; H01L 2224/32225; H01L 2224/16225; H01L 23/5389; H01L 2924/18161; H01L 2924/181; H01L 2224/24137; H01L 23/3121; H01L 24/97; H01L 25/042; H01L 2224/16221
    USPC .......................................................... 257/433
    See application file for complete search history.

(56) References Cited

U.S. PATENT DOCUMENTS

| | | | |
|---|---|---|---|
| 2016/0054173 A1* | 2/2016 | Kim | ............... H01L 27/14621 |
| | | | 250/208.1 |
| 2018/0012863 A1* | 1/2018 | Yu | ..................... H01L 21/6835 |
| 2018/0337142 A1* | 11/2018 | Cheng | ..................... H01L 24/20 |
| 2019/0051612 A1 | 2/2019 | Kim et al. | |

* cited by examiner

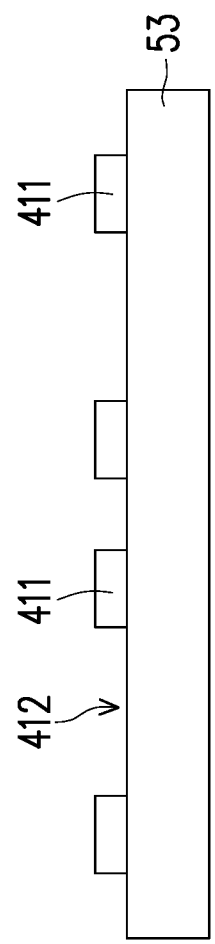

SEMICONDUCTOR PACKAGE AND MANUFACTURING METHOD THEREOF

CROSS-REFERENCE TO RELATED APPLICATION

This application is a continuation-in-part application of and claims the priority benefit of U.S. application Ser. No. 15/715,169, filed on Sep. 26, 2017, now pending. The entirety of the above-mentioned patent application is hereby incorporated by reference herein and made a part of this specification.

BACKGROUND OF THE INVENTION

1. Field of the Invention

The present invention generally relates to a semiconductor package and a manufacturing method thereof, and more particularly, to a semiconductor package and a manufacturing method having a sensing area on a semiconductor chip.

2. Description of Related Art

In recent years, electronic apparatus, such as smart phones, tablet computers, wearable electronic device, and so forth, increasingly employ sensors to control the manipulation of a variety of functions provided by the device. Due to the increasing demands for high manufacturability and quality of the sensor packages, there are needs for flexibility and reliable methods for packaging the chips with sensors. Improving conventional methods of packaging the sensing chips is therefore desirable in order to achieve sensor packages with better operating performances and greater manufacturability.

SUMMARY OF THE INVENTION

The disclosure provides a semiconductor package and a manufacturing method thereof, which achieves optimal wafer level integration and interconnect form semiconductor chips having sensors.

The disclosure provides a semiconductor package including a plurality of first chips, a plurality of through silicon vias, a least one insulator, a first circuit structure and a first encapsulant. Each of the first chips includes a first active surface, a sensing area on the first active surface, a first back surface opposite to the first active surface and a plurality of through holes extending from the first back surface towards the first active surface. The through silicon vias are disposed in the through holes of the first chips and electrically connected to the first chips. The insulator is disposed on the first active surfaces of the first chips. The first circuit structure is disposed on the first back surfaces of the first chips and electrically connected to the through silicon vias. The first encapsulant laterally encapsulates the first chips.

The disclosure provides a manufacturing method of a semiconductor package. The method includes at least the following steps: providing a first chip, wherein the first chip comprises a first active surface, a sensing area on the first active surface, a first back surface opposite to the first active surface and a plurality of through holes extending from the first back surface towards the first active surface; forming a plurality of through silicon vias in the through holes of the first chip; forming a first circuit structure on the first back surface of the first chip to electrically connect the through silicon vias; disposing a second chip on the first circuit structure, wherein the second chip comprises a second active surface facing towards the first back surface of the first chip, and the second chip is electrically connected to the first chip; and forming a second encapsulant on the first circuit structure to laterally encapsulate the second chip.

The disclosure provides a manufacturing method of a semiconductor package. The method includes at least the following steps: providing a plurality of first chips, each of the first chips comprising a first active surface, a sensing area on the first active surface, a first back surface opposite to the first active surface and a plurality of through holes extending from the first back surface towards the first active surface; forming a plurality of through silicon vias in the through holes of the first chip; forming a first circuit structure on the first back surface of the first chip to electrically connect the through silicon vias; providing a carrier; providing at least one insulator; bonding the carrier, the insulator, and the first chips with the through silicon vias and the first circuit structure, wherein the insulator is disposed between the carrier and the first chips, the first active surfaces of the first chips facing towards the insulator, and the first chips disposed on the carrier are physically separated from each other; forming a first encapsulant on the carrier, wherein the first encapsulant laterally encapsulates the first chips; and forming a second circuit structure on the first encapsulant.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A to FIG. 4D are schematic cross-sectional views illustrating a manufacturing method of a semiconductor package according to an embodiment of the disclosure.

DESCRIPTION OF THE EMBODIMENTS

Figure 1A:
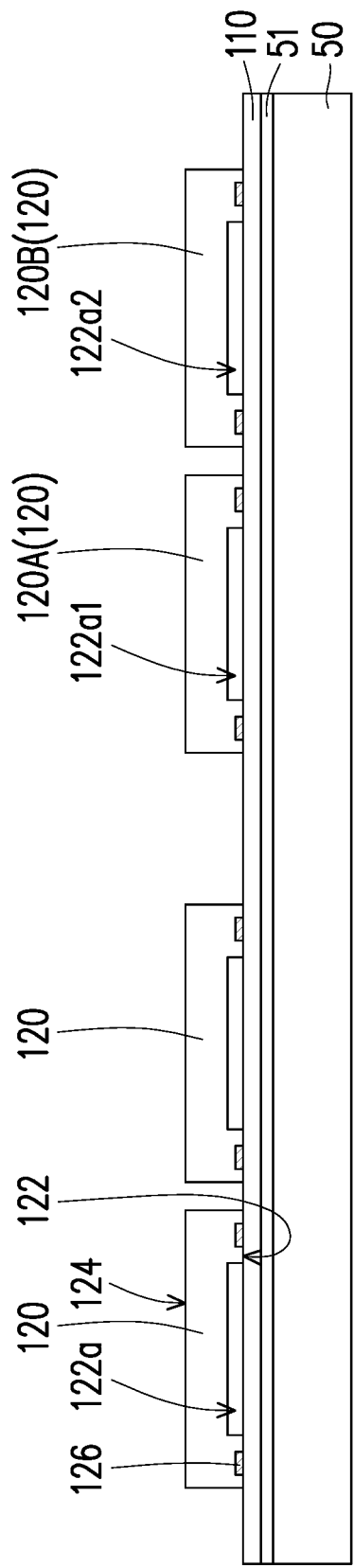
FIG. 1A to FIG. 1J are schematic cross-sectional views illustrating a manufacturing method of a semiconductor package according to an embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
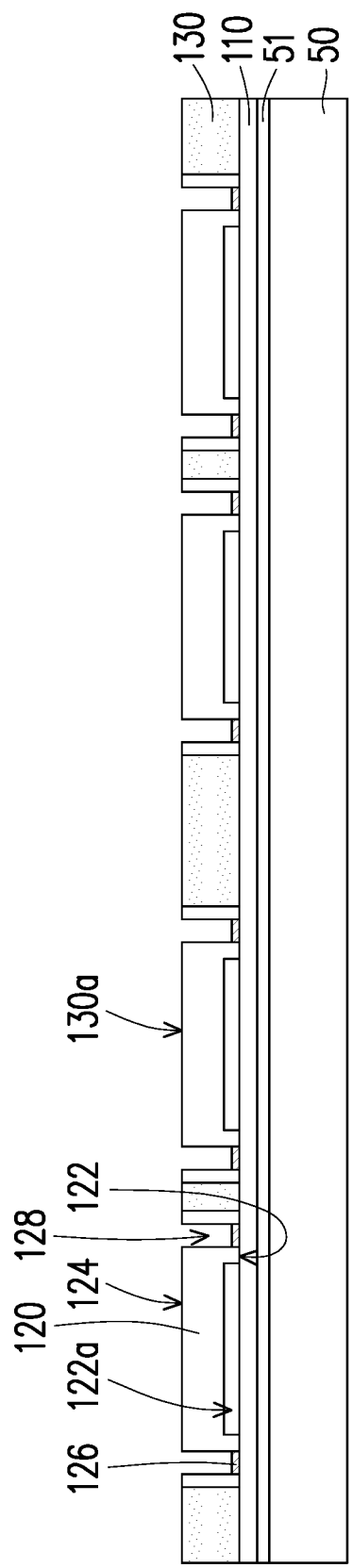
Figure 1C:
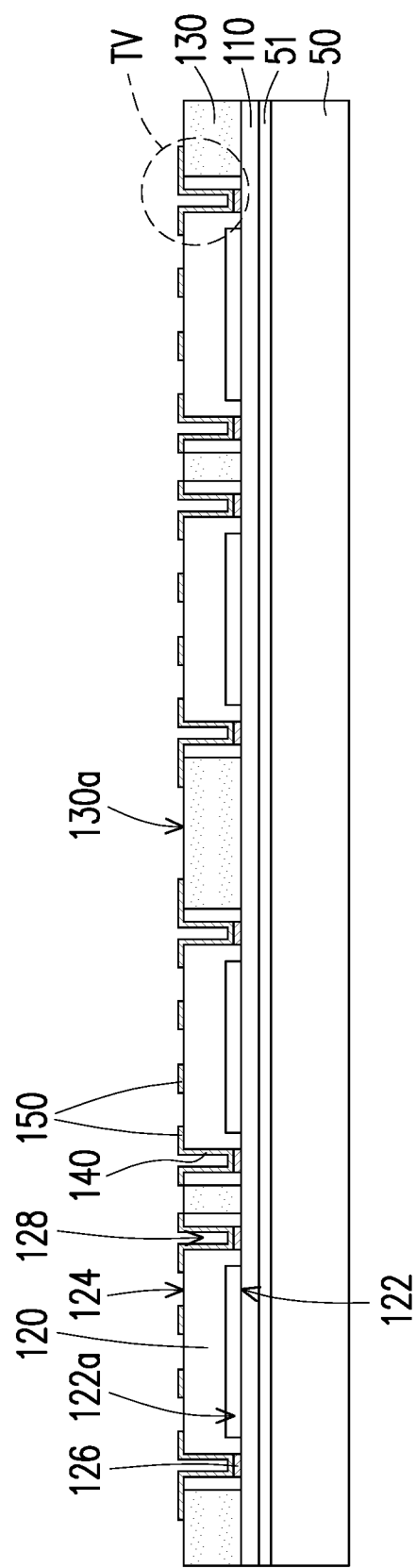
Figure 1D:
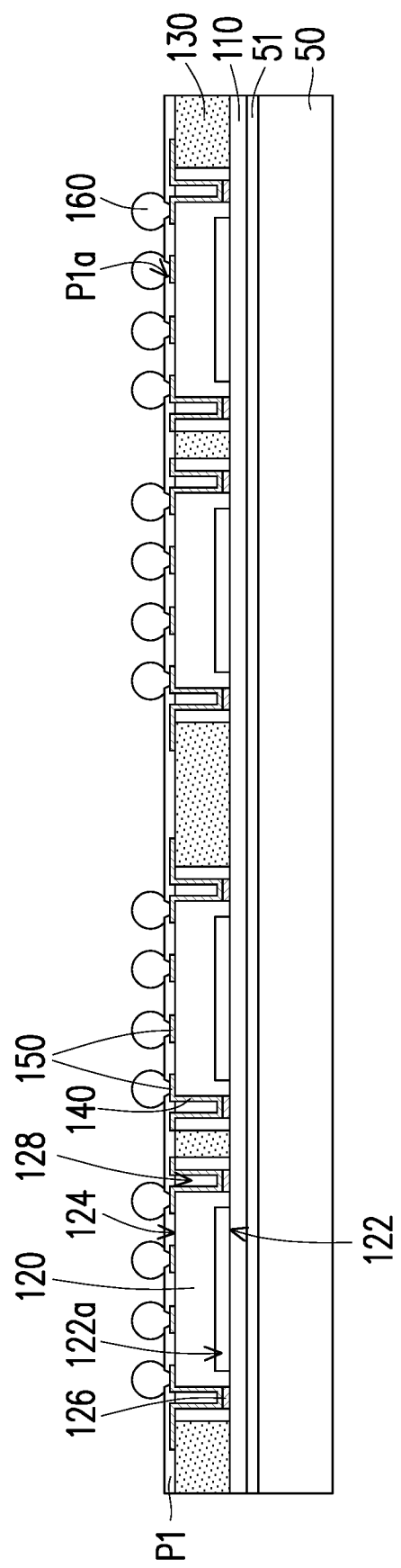
Figure 1E:
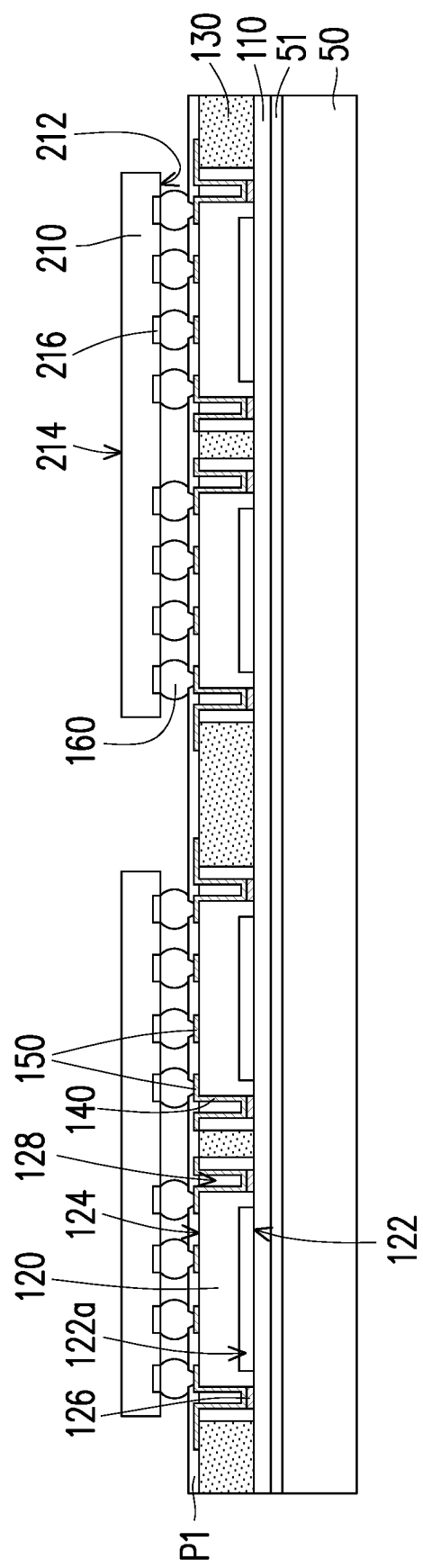
Figure 1F:
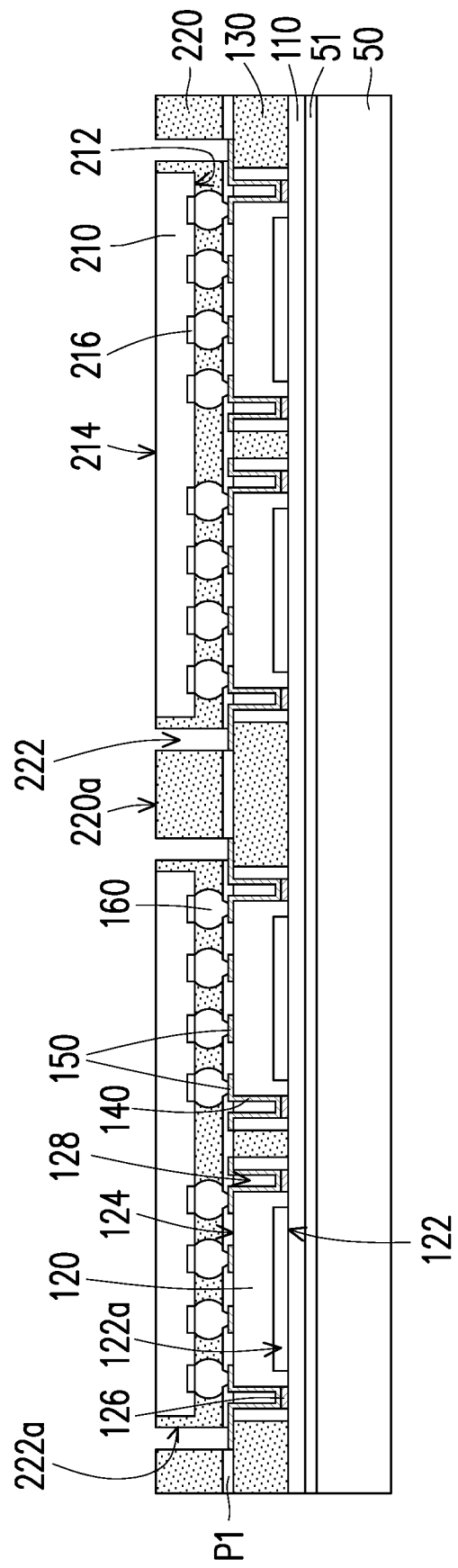
Figure 1G:
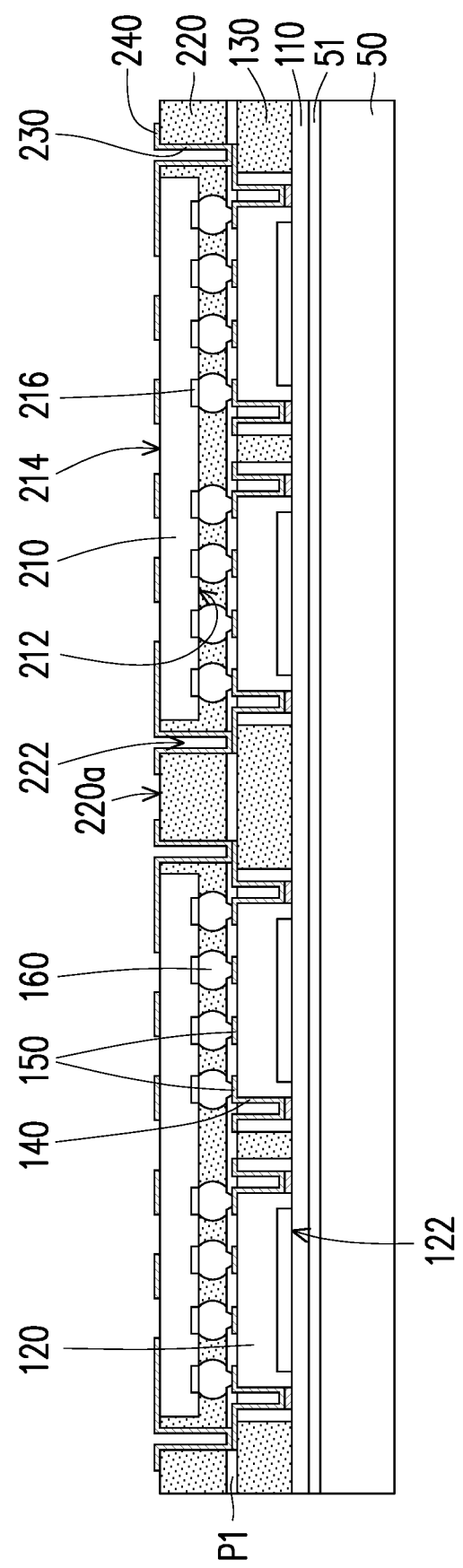
Figure 1H:
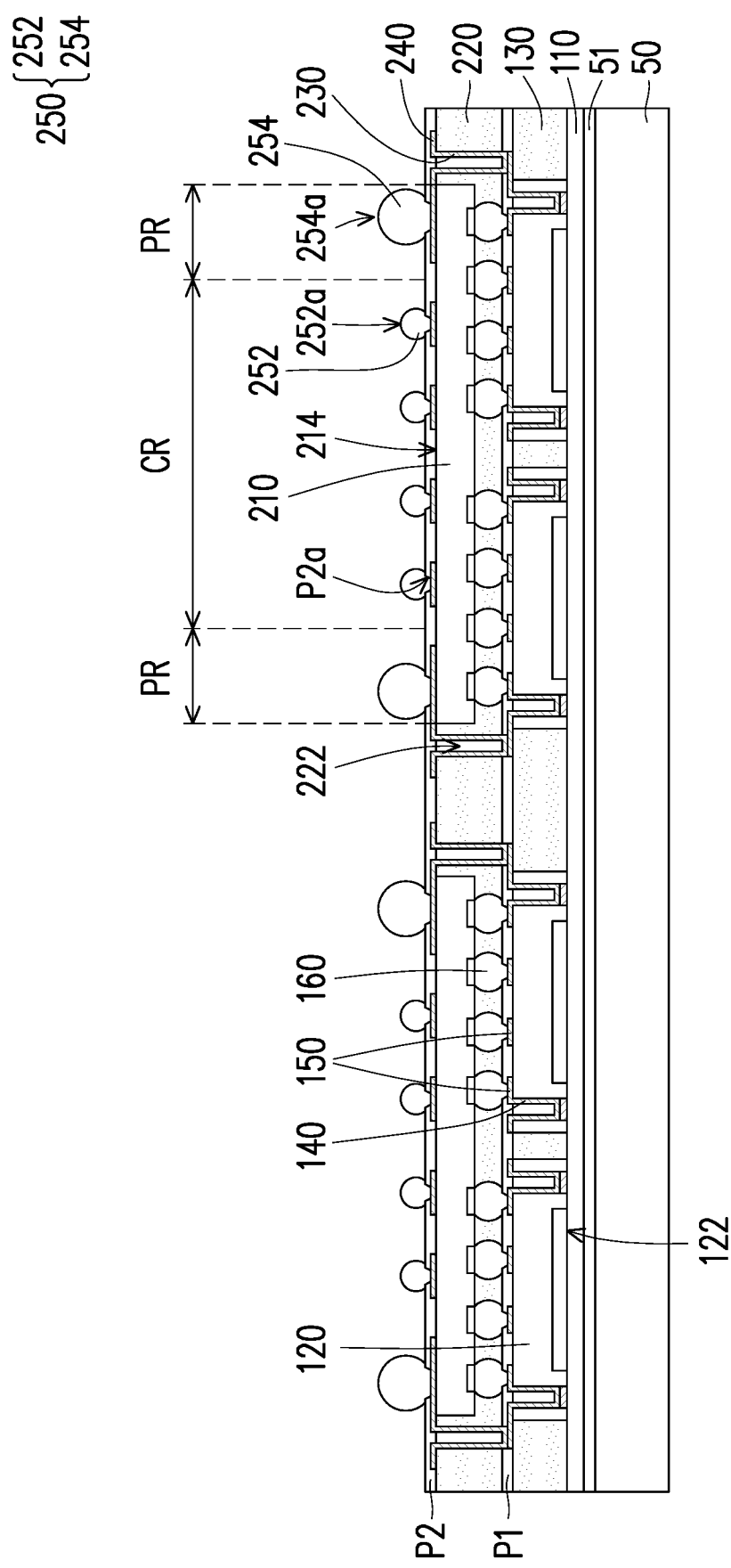
Figure 1I:
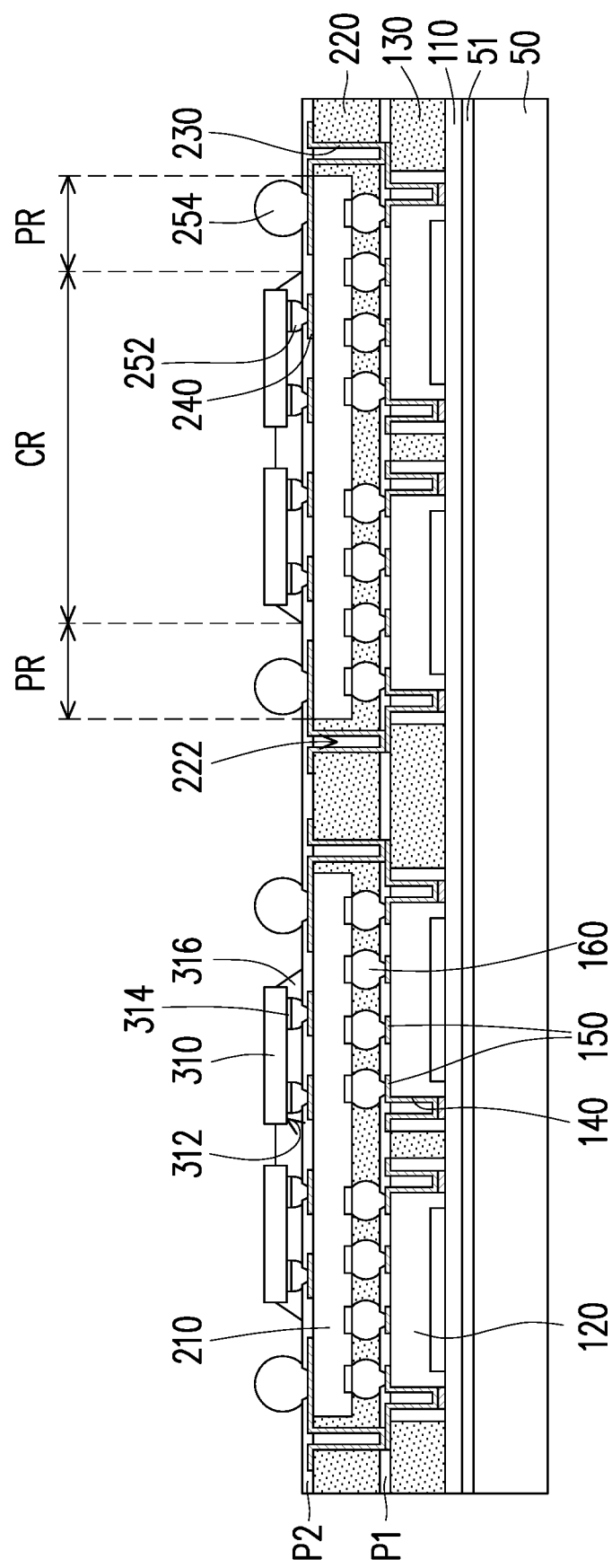
Figure 1J:
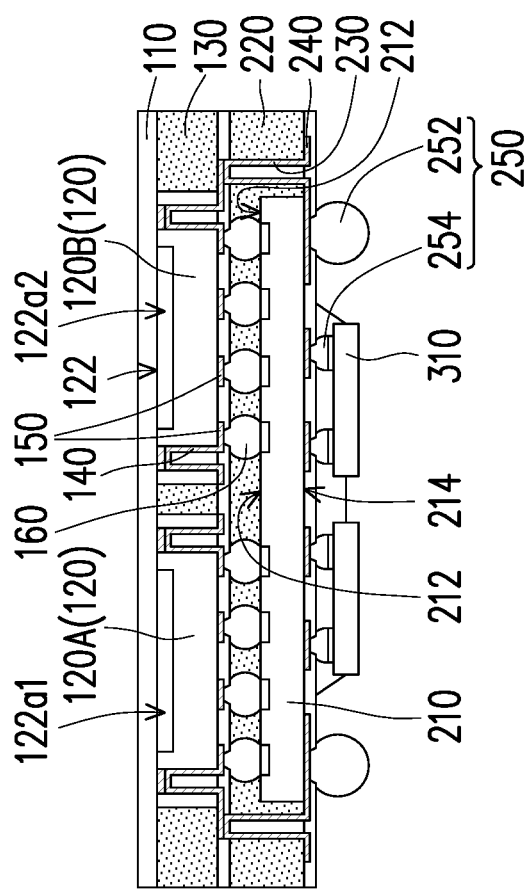
Figure 2A:
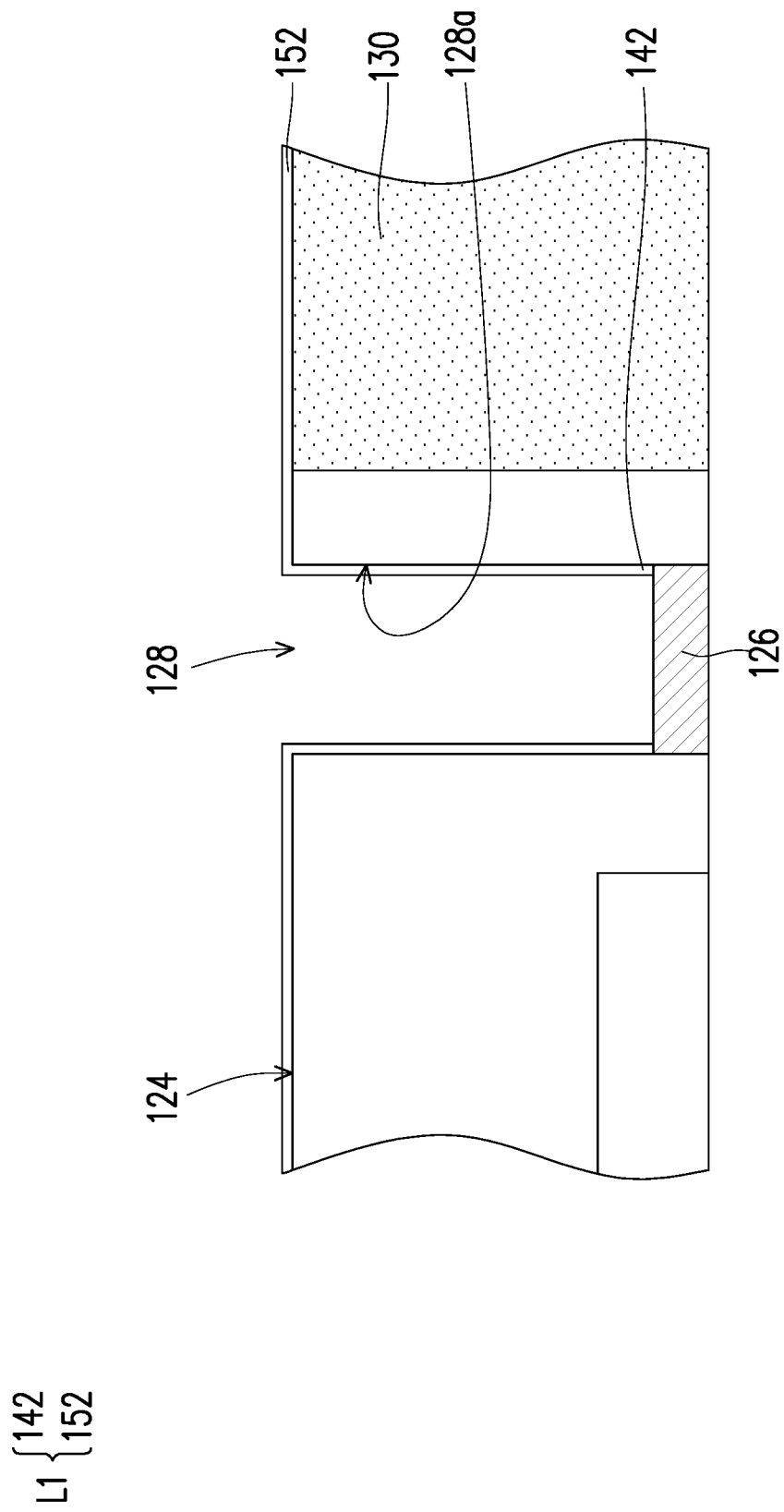
FIG. 2A and FIG. 2B are schematic cross-sectional views illustrating a manufacturing method of the enlarged TV area the semiconductor package in FIG. 1C.
Figure 2B:
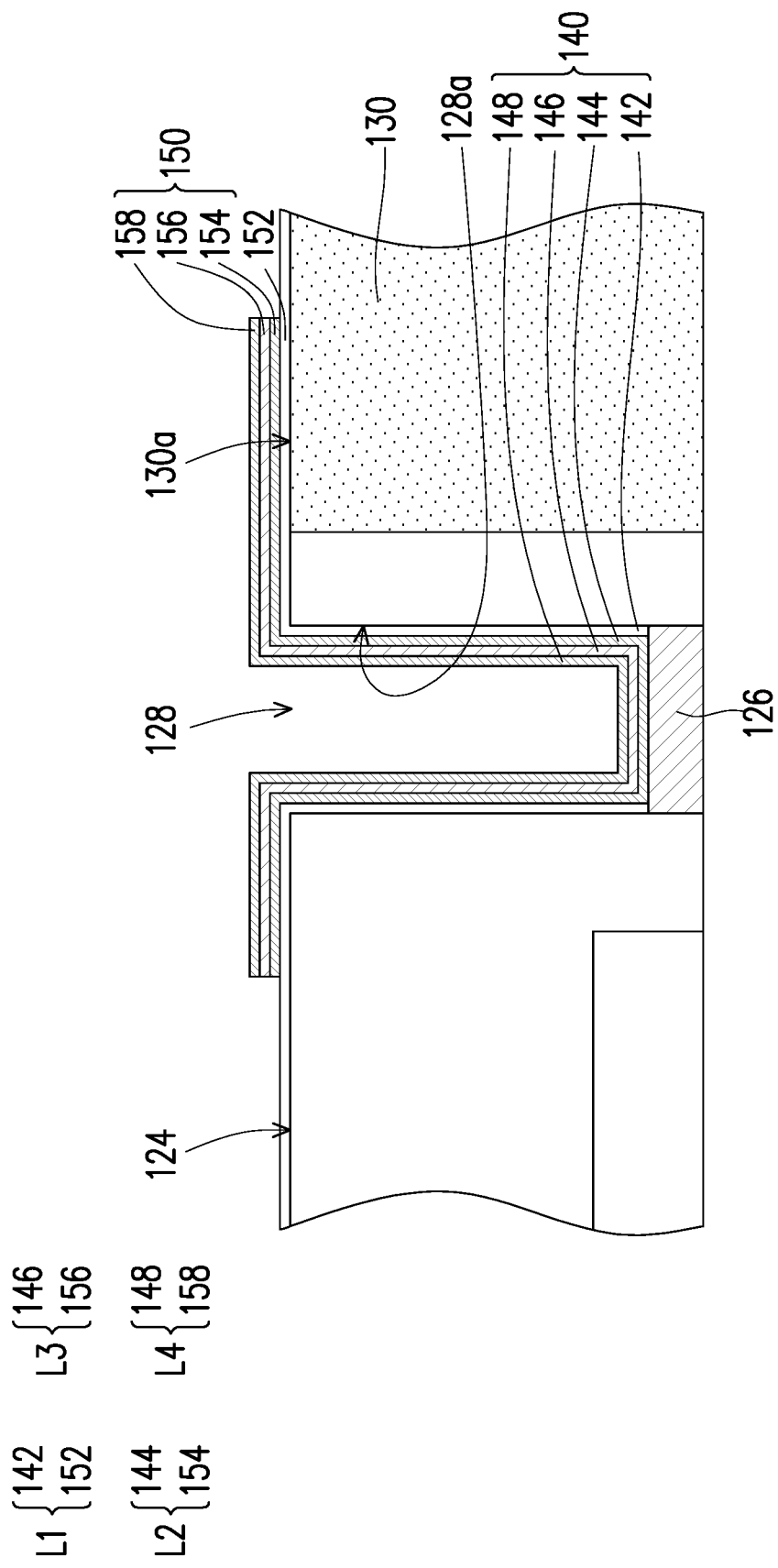

FIG. 1A to FIG. 1J are schematic cross-sectional views illustrating a manufacturing method of a semiconductor package according to an embodiment of the disclosure and FIG. 2A and FIG. 2B are schematic cross-sectional views illustrating a manufacturing method of the enlarged TV area the semiconductor package in FIG. 1C.

Referring to FIG. 1A, a temporary carrier 50 may be provided. The temporary carrier 50 may be a glass substrate, a wafer substrate, or other suitable substrate material as long as the material is able to withstand the subsequent processes while carrying the package formed thereon.

In the embodiment, a de-bonding layer 51 may be formed on the temporary carrier 50 to enhance the releasability of the structure (e.g., an intermediate structure during the manufacturing process) from the temporary carrier 50 in the subsequent processes. For example, the de-bonding layer 51 may be a light to heat conversion (LTHC) release layer or other suitable release layers.

An insulator 110 may be formed on the temporary carrier 50. For example, the insulator 110 may be formed from an insulating material such as polymer, curable resin, or other suitable protective materials via a deposition process, a spin coating process, a slit coating process or other suitable processes. In an embodiment, the insulator 110 may be referred to a cover layer or a hard coating layer.

In the embodiment, insulator 110 may be formed on the de-bonding layer 51, but the disclosure is not limited thereto.

In an embodiment not shown, the insulator 110 may be formed directly on the temporary carrier 50.

After forming the insulator 110, a plurality of first chip 120 may be disposed on the insulator 110. The amount of the first chips 120 in FIG. 1A merely serves as an exemplary illustration and the disclosure is not limited thereto. For example, four first chips are exemplary illustrated in FIG. 1A.

In an embodiment, after disposing the first chip 120, a curing process may be performed on the insulator 110 to enhance protection of the first chip 120 depending on the design requirements.

The first chip 120 has a first active surface 122, a sensing area 122a on the first active surface 122, and a first back surface 124 opposite to the first active surface 122. The first chip 120 may be disposed on the insulator 110 with the first active surface 122 facing towards the insulator 110.

In the embodiment, the first chip 120 may include a plurality of first conductive pads 126 on the first active surface 122 surrounding the sensing area 122a.

In the embodiment, the first conductive pads 126 on the first active surface 122 of the first chip 120 may be covered by the insulator 110. In an embodiment, the sensing area 122a and the first conductive pads 126 on the first active surface 122 of the first chip 120 may be covered by the insulator 110.

In the embodiment, the first chip 120 may be a sensor chip. Any suitable sensor may be applied to the first chips 120 according to the design requirement, the disclosure is not limited thereto.

In the embodiment, the first chip 120 may include optical sensors which may employ photodetectors such as photodiodes, phototransistors, or the like, to sense light and convert the received light energy into electrical signals for processing by the electronic circuitry on the first chip 120.

In such cases, the insulator 110 may be translucent or transparent to pass light to the sensing area 122a of the first chips 120.

In an embodiment, the first chip (e.g., the first chip in FIG. 4B, 5 or 6B) may include molecular sensor which may employ chemosensor, biosensor, or the like. In an embodiment not shown, the first chip may be a MEMS chip.

In the embodiment, a plurality of first chips 120 may include a first chip 120A (may be referred a first sensor chip) and a first chip 120B (may be referred a second sensor chip). The photosensitive material included in the sensing area 122a1 of the first chip 120A may be different form the photosensitive material included in the sensing area 122a2 of the first chip 120B. As such, the sensing wavelength range of the first chip 120A may be different from the sensing wavelength range of the first chip 120B. In other words, multiple first chips 120 with optical sensors may individually collect distinct wavelengths of light and provide complementary spectral responsivity. For example, the first chip 120A is an infrared (IR) detector chip, and the first chip 120B is a visible light detector chip, but the disclosure is not limited thereto.

Referring to FIG. 1B, a first encapsulant 130 may be formed on the temporary carrier 50 to laterally encapsulate the first chips 120.

In an embodiment, the first encapsulant 130 may be formed from an insulating material such as resin (e.g., epoxy) or other suitable insulating material via a molding process (e.g., over-molding process) or other suitable process. In an embodiment, a thickness of the aforementioned insulating material formed on the temporary carrier 50 may be greater than the thickness of the first chips 120. In such case, the thickness of the insulating material may be reduced to expose the first back surfaces 124 of the first chips 120 using, for example, a grinding process, a polishing process or other suitable process.

In an embodiment, a portion of the bulk semiconductor material (e.g., bulk silicon) on the backside (e.g., a side opposite to the first active surface 122) of the first chips 120 may be removed during the thickness reducing process, but the disclosure is not limited thereto.

The first back surface 124 of the first chips 120 may be coplanar with the top surface 130a (e.g., a surface of the first encapsulant 130 facing away to the temporary carrier 50) of the first encapsulant 130.

After forming the first encapsulant 130, a plurality of through holes 128 may be formed from the first back surface 124 towards the first active surface 122 on each of the first chips 120 using etching, drilling, or other suitable process to expose the first conductive pads 126.

Referring to FIG. 1C, FIG. 2A and FIG. 2B, a plurality of through silicon vias (TSVs) 140 may be formed in the through holes 128 of each of the first chips 120 to electrically connect to the first conductive pads 126. A first circuit structure 150 electrically connected to the through silicon vias 140 may be formed on the first back surfaces 124 of the first chips 120.

In the embodiment, a portion of the first circuit structure 150 may be formed on the top surface 130a of the first encapsulant 130, the disclosure is not limited thereto.

In the embodiment, the conductive portion of the first circuit structure 150 and the conductive portion of the through silicon vias 140 may be formed simultaneously during a same process or a similar process (e.g. deposition process), but the disclosure is not limited thereto.

In an embodiment, the first circuit structure 150 may be used to redistribute the conductive trace for signal transmitting of the first chips 120. In an embodiment, the first circuit structure 150 may be referred to a redistribution layer.

The formation of the through silicon vias 140 and the first circuit structure 150 are exemplified as follows.

Referring to FIG. 2A, an insulating material may be formed in the through holes 128 and on the first back surfaces 124 of the first chips 120 using, for example, a deposition process, a spin coating process, or other suitable process. The insulating material may be made of polymer, such as polyimide, polybenzoxazole (PBO), benzocyclobutene (BCB), or made of silicon oxide, such as tetraethoxysilane (TEOS) Chemical Vapor Deposition (CVD) silicon oxide, Atomic layer deposition (ALD) silicon oxide, or the like.

After forming the insulating material, a bottom portion of the insulating material inside the through holes 128 may be removed to expose the first conductive pads 126 using, for example, etching process to form an insulating layer L1. For example, the insulating layer L1 may include a first insulating portion 142 formed on the inner sidewall 128a of the through holes 128 and a second insulating portion 152 formed on the first back surface 124 and coupled to the first insulating portion 142.

In an embodiment, the second insulating portion 152 may completely cover the first back surfaces 124 of the first chips 120, but the disclosure is not limited thereto. In an embodiment, the second insulating portion 152 may completely cover the first back surfaces 124 of the first chips 120 and the top surface 130a of the first encapsulant, but the disclosure is not limited thereto.

Referring to FIG. 2B, after the insulating layer L1 is formed, a barrier layer L2, a seed layer L3 and a conductive layer L4 may be formed in the through holes 128 and on the first back surface 124 of the first chip 120 to cover the insulating layer L1 and the first conductive pads 126.

In the embodiment, after forming the barrier layer L2, at least a portion of the insulating layer L1 on the first back surface 124 of the first chip 120 may be exposed by the barrier layer L2.

In an embodiment, the seed layer L3 may be conformally formed on the barrier layer L2 and the conductive layer L4 may be conformally formed on the seed layer L3. In other words, the barrier layer L2, the seed layer L3 and the conductive layer L4 which are conform to each other may be referred to as a single layer.

In an embodiment, the barrier layer L2 serving as a diffusion barrier may prevent migration of conductive layers formed thereon into dielectric. The seed layer L3 may improve the adhesion of the conductive layer L4 into the through holes 128. In an embodiment, the conductive layer L4 may be plated as pillars filling the through holes 128. A material of the barrier layer L2 may include titanium, tantalum, or other suitable materials. A material of the seed layer L3 may include copper, gold, nickel, or an alloy thereof. A material of the conductive layer L4 may include copper, gold, silver, or a combination thereof.

For example, the barrier layer L2 may include a first barrier portion 144 formed in the through holes 128 and coupled to the first conductive pads 126 and a second barrier portion 154 formed on the first back surface 124 and coupled to the first barrier portion 144. The seed layer L3 covering the barrier layer L2 may include a first seed portion 146 formed in the through holes 128 and a second seed portion 156 formed on the first back surface 124 and coupled to the first seed portion 146. The conductive layer L4 covering the seed layer L3 may include a first conductive portion 148 formed in the through holes 128 and a second conductive portion 158 formed on the first back surface 124 and coupled to the first conductive portion 148.

In the embodiment, the portions formed in the through holes 128 (e.g., the first insulating portion 142 of the insulating layer L1, the first barrier portion 144 of the barrier layer L2, the first seed portion 146 of the seed layer L3 and the first conductive portion 148 of the conductive layer L4) may be referred to as the through silicon vias 140.

At least the conductive portion formed on the first back surface 124 (e.g., the second barrier portion 154 of the barrier layer L2, the second seed portion 156 of the seed layer L3, and/or the second conductive portion 158 of the conductive layer L4) may referred to the first circuit structure 150. In an embodiment, the first circuit structure 150 may include a conductive portion (e.g., the second barrier portion 154 of the barrier layer L2, the second seed portion 156 of the seed layer L3, and/or the second conductive portion 158 of the conductive layer L4) and an insulating portion (e.g., the second insulating portion 152 of the insulating layer L1).

The through silicon vias 140 extending through the first chip 120 and electrically connected to the first circuit structure 150 may provide I/O contact with the first conductive pads 126 at the back surface 124 of the first chip 120.

Referring to FIG. 1D, a plurality of conductive features 160 may be formed on the first circuit structure 150 using, for example, a plating process, a ball placement process or other suitable process.

In an embodiment, a first passivation layer P1 having a plurality of openings P1a may be formed on the first circuit structure 150 and/or the first encapsulant 130. For example, a passivation material (e.g. epoxy, polyimide, polybenzoxazole (PBO), benzocyclobutene (BCB)) may be formed over the first circuit structure 150 and the first encapsulant 130. Next, a portion of the passivation material may be removed to form the first passivation layer P1 with openings P1a to expose at least a portion of the first circuit structure 150. In an embodiment, the first passivation layer P1 may include a photoresist material and the openings P1a may be formed by exposure and developing processes. Subsequently, the conductive features 160 may be formed in the openings P1a of the first passivation layer P1 to directly contact the exposed first circuit structure 150 and electrically connect the first chips 120. In an embodiment, the conductive features 160 may include conductive balls, conductive pillars, conductive bumps or a combination thereof. However, it construes no limitation in the disclosure. Other possible forms and shapes of the conductive features 160 may be utilized according to the design requirement. A soldering process and a reflowing process are optionally performed for enhancement of the adhesion between the conductive features 160 and the first circuit structure 150.

Referring to FIG. 1E, a second chip 210 may be disposed on the first circuit structure 150 through the conductive features 160.

The second chip 210 may include a second active surface 212 facing towards the first back surfaces 124 of the first chips 120, a second back surface 214 opposite to the second active surface 212, and a plurality of second conductive pads 216 distributed on the second active surface 212. In other words, the second active surface 212 of the second chip 210 and the first active surface 122 of the first chip 120 may face towards each other. The second chip 210 may be electrically connected to the first chips 120 through the first circuit structure 150. In other words, the electrical signals going through the first chips 120 can be routed through the first conductive pads 126 to the through silicon vias 140, the first circuit structure 150, the conductive features 160, and to the second conductive pads 216 of the second chip 210.

Referring to FIG. 1F, a second encapsulant 220 is formed on the first circuit structure 150 to laterally encapsulate the second chip 210 and the conductive features 160. In other words, the second semiconductor 210 encapsulated by the second encapsulant 220 may be disposed on the first chips 120 and the first encapsulant 130.

In an embodiment, the second encapsulant 220 may be similar with the first encapsulant 130. For example, the second encapsulant 220 may be formed from an insulating material such as resin (e.g., epoxy) or other suitable insulating material via a molding process (e.g., over-molding process) or other suitable process. In an embodiment, a thickness of the aforementioned insulating material formed on the first circuit structure 150 may be greater than the thickness of the second chip 210. In such case, the thickness of the insulating material may be reduced to expose the second back surfaces 214 of the second chip 210 using, for example, a grinding process or other suitable process.

In an embodiment, a portion of the bulk semiconductor material (e.g., bulk silicon) on the backside (e.g., a side opposite to the second active surface 212) of the second chip 210 may be removed during the thickness reducing process, but the disclosure is not limited thereto.

The second back surface 214 of the second chip 210 may be coplanar with the top surface 220a of the second encapsulant 220. The top surface 220a of the second encapsulant 220 is a surface facing away to the first encapsulant 130.

In an embodiment, after forming the second encapsulant 220, a plurality of through holes 222 may be formed on the second encapsulant 220 surrounding the second chip 210 using, for example, a laser drilling process, a mechanical drilling process or other suitable process. The through holes 222 may expose at least a portion of the first circuit structure 150.

Referring to FIG. 1G, a plurality of through molding vias (TMVs) 230 may be formed in the through holes 222 to be electrically connected to the first circuit structure 150 and the first chips 120. A second circuit structure 240 electrically connected to the through molding vias 230 may be formed on the second back surface 214 of the second chip 210.

In an embodiment, the second circuit structure 240 may be used to redistribute the conductive trace for signal transmitting of the second chip 210. In an embodiment, the second circuit structure 240 may be referred to a redistribution layer.

In an embodiment, the through molding vias 230 and the second circuit structure 240 may be formed simultaneously during a same process or a similar process (e.g. deposition process), but the disclosure is not limited thereto.

For example, a conductive material (not shown), such as copper, aluminium, nickel, or the like, may be formed over the second back surface 214 of the second chip 210 and in the through holes 222 of the second encapsulant 220 through a sputtering process, a deposition process, an electroplating process, or other suitable process. Next, the conductive material may be patterned by a photolithography and etching process to form the patterned conductive layer. A portion of the patterned conductive layer formed in the through holes 222 may be referred to the through molding vias 230 and another portion of the patterned conductive layer formed on the second back surface 214 of the second chip 210 may be referred to the second circuit structure 240. In an embodiment, a seed material may be formed over the second back surface 214 of the second chip 210 and in the through holes 222 of the second encapsulant 220 before the conductive material.

Referring to FIG. 1H, a plurality of conductive terminals 250 may be formed on the second circuit structure 240 to be electrically connected to the first chips 120 and the second chip 210.

In an embodiment, a second passivation layer P2 having a plurality of openings P2a may be formed on the second encapsulant 220 to cover the second circuit structure 240 and at least a portion of the second circuit structure 240 may be exposed by the openings P2a of the second passivation layer P2. The forming process of the second passivation layer P2 may be similar with the first passivation layer P1 and the detailed descriptions are omitted.

After forming the second passivation layer P2, the conductive terminals 250 may be formed in the openings P2a of the second passivation layer P2 to directly contact the exposed second circuit structure 240 and electrically connect to the second chip 210. The conductive terminals 250 may include conductive balls, conductive pillars, conductive bumps, or a combination thereof formed by, for example, a ball placement process, a plating process, or other suitable process. However, it construes no limitation in the disclosure. Moreover, a soldering process and a reflowing process are optionally performed for enhancement of the adhesion between the conductive terminals 250 and the second circuit structure 240.

In an embodiment, the conductive terminals 250 may include a plurality of first elements 252 formed in a central region CR of the second chip 210 and a plurality of second elements 254 formed in a peripheral region PR of the second chip 210 surrounding the central region CR. The size of the second elements 254 may be larger than the size of the first elements 252. In other words, the shortest distance from the top surfaces 252a of the first elements 252 to the second circuit structure 240 may be less than the shortest distance from the top surfaces 254a of the second elements 254 to the second circuit structure 240. In some alternative embodiments, the top surfaces 252a of the first elements 252 may be aligned with the top surfaces 254a of the second elements 254.

Referring to FIG. 1I, a third chip 310 may be disposed on the second circuit structure 240. For example, the third chip 310 may include a front surface 312 facing towards the second back surface 214 of the second chip 210 and a plurality of conductive connectors 314 distributed on the front surface 312. The conductive connectors 314 of the third chip 310 may be electrically connected to the second circuit structure 240.

In an embodiment, the third chip 310 may be disposed on the second circuit structure 240 before forming the conductive terminals 250. In such case, after the third chip 310 is disposed on the second circuit structure 240 using flip-chip technique, forming the first elements 252 of the conductive terminals 250 may be omitted. In other words, the third chip 310 may be electrically connected to the second circuit structure 240 directly through the conductive connectors 314 which may serve as the first elements 252 such that forming the first elements 252 of the conductive terminals 250 may be unnecessary.

In an embodiment, an underfill 316 may be formed in the gap between the third chip 310 and the second passivation layer P2 to enhance the reliability of the attachment process. In an exemplary embodiment, the third chip 310 serving as a memory is electrically connected to the first chip 120 having the sensing area 122a and the second chip 210 which serves as a processor. In such cases, the third chip 310 may be executed by the second chip 210 to perform various applications.

In an embodiment, more than one third chips 310 serving different functions may be disposed on the second circuit structure 240. The amount of the third chips 310 in FIG. 1I merely serves as an exemplary illustration and the disclosure is not limited thereto.

A singulation process may be performed and the temporary carrier 50 may be removed such that the manufacturing process of a semiconductor package 100 is substantially completed as shown in FIG. 1J.

In an embodiment, after disposing the third chips 310, the singulation process may be performed. After the singulation process, the temporary carrier 50 may be removed from the insulator 110. For example, the external energy such as UV laser, visible light or heat, may be applied to the de-bonding layer 51 so that the temporary carrier 50 may be peeled off from the insulator 110.

In an embodiment, the singulation process may be performed before disposing the third chip 310. The process sequence of the singulation and disposing the third chip 310 construes no limitation in the disclosure.

The aforementioned manufacturing method of the semiconductor package 100 integrating the first chip 120, the second chip 210 and the third chip 310 may achieve better operating performances and greater manufacturability.

FIG. 3A to FIG. 3D are schematic cross-sectional views illustrating a manufacturing method of a semiconductor package according to an embodiment of the disclosure. The manufacturing method of the present embodiment is similar to the embodiment illustrated in FIG. 1A to FIG. 1J and the process descriptions may be omitted.

Figure 3A:
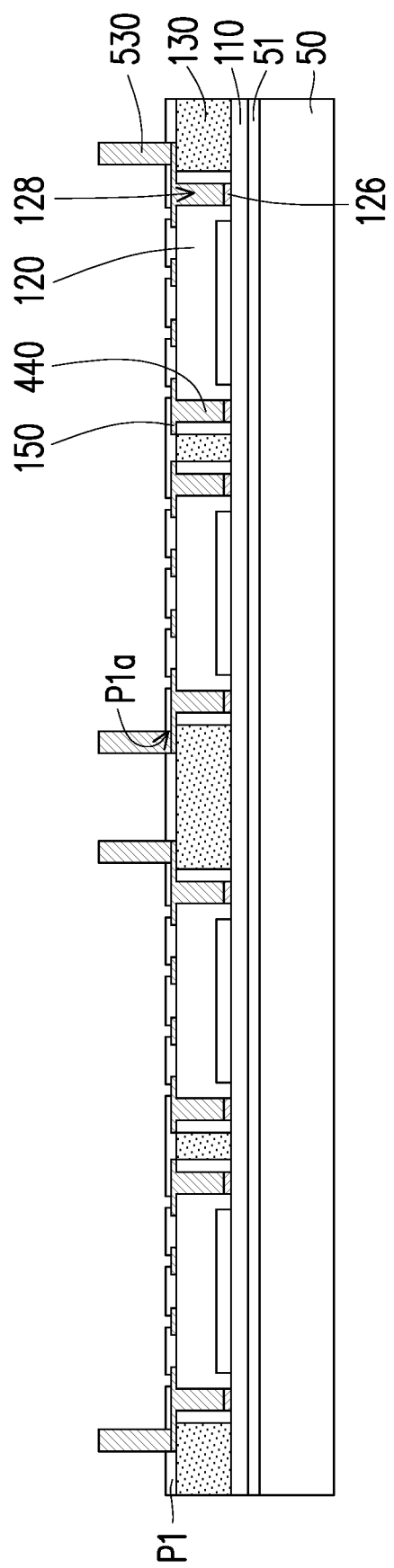
FIG. 3A to FIG. 3D are schematic cross-sectional views illustrating a manufacturing method of a semiconductor package according to an embodiment of the disclosure.

Referring to FIG. 3A, the through silicon vias 140 may be formed as pillars filling the through holes 128 of the first chip 120 and electrically connected to the first circuit structure 150. For example, the topmost conductive layer L4 as shown in FIG. 2B may be formed to fill the through holes 128 after the insulating layer L1, the barrier layer L2 and the seed layer L3 are formed. Next, after forming the first circuit structure 150 and the through silicon vias 140, the first passivation layer P1 may be formed on the first circuit structure 150 and the first encapsulant 130. The first passivation layer P1 having the openings P1a exposes at least a portion of the first circuit structure 150. Subsequently, a plurality of the through molding vias 530 may be formed on the exposed first circuit structure 150.

For example, a patterned photoresist layer (not shown) having a predetermined pattern may be formed over the first passivation layer P1 by such as spin coating of a photoresist material layer, baking of the photoresist material layer, and photolithography (i.e. exposure and development processes). Portions of the exposed first circuit structure 150 may be further exposed by the patterned photoresist layer. Next, the through molding vias 530 may be formed by such as a plating process or other suitable process on the exposed first circuit structure 150 which is also revealed by the patterned photoresist layer. After the through molding vias 530 are formed, the patterned photoresist layer may be stripped by, for example, etching, ash or other suitable removal processes.

Figure 3B:
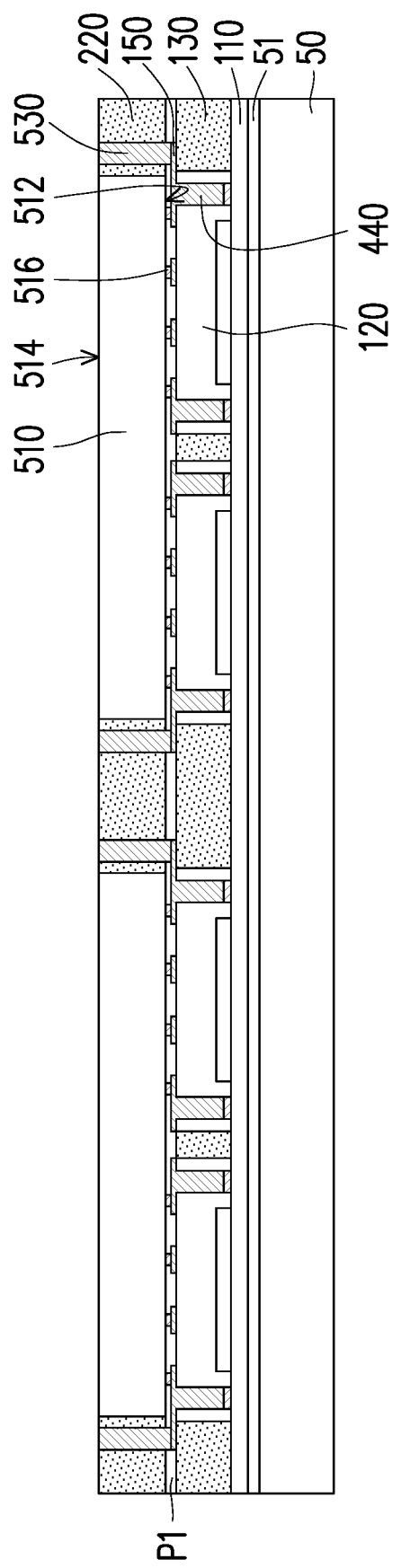

Referring to FIG. 3B, after forming the through molding vias 530, the second chip 510 may be disposed on the first circuit structure 150 through flip-chip bonding. In other words, in the present embodiment, a flip-chip technique is employed and the first chips 120 and the second chip 510 are electrically connected through the second conductive pads 516 distributed on the second active surface 512. Compared with the embodiment illustrated in FIG. 1E, in the present embodiment, the conductive features formed between the first chips 120 and the second chip 510 may be omitted. In an embodiment, the through molding vias 530 may be formed surrounding the first chips 120 and the second chip 210 may be disposed on the first circuit structure 150 with the first chips 150 overlying the second chip 510. Subsequently, the second encapsulant 220 may be formed to laterally encapsulate the second chip 510 and the through molding vias 530. The forming process of the second encapsulant 220 may be similar with the embodiments illustrated in FIG. 1F and the detailed descriptions are omitted. The thickness of the second encapsulant 220 may be reduced to expose at least a portion of the through molding vias 530 for further electrical connection.

Figure 3C:
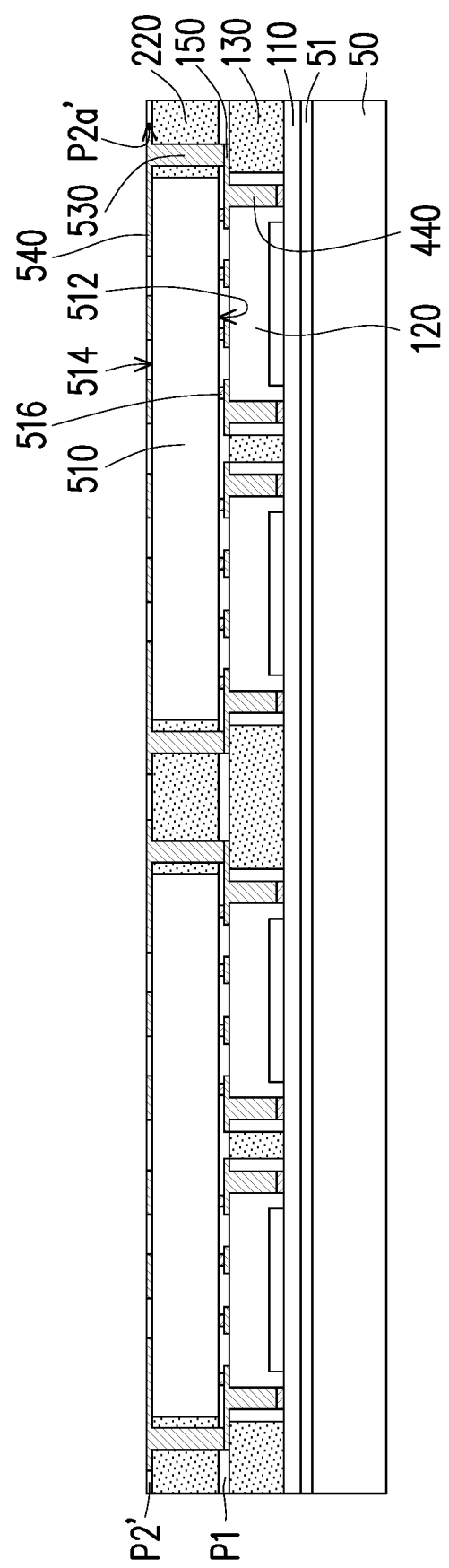
Figure 3D:
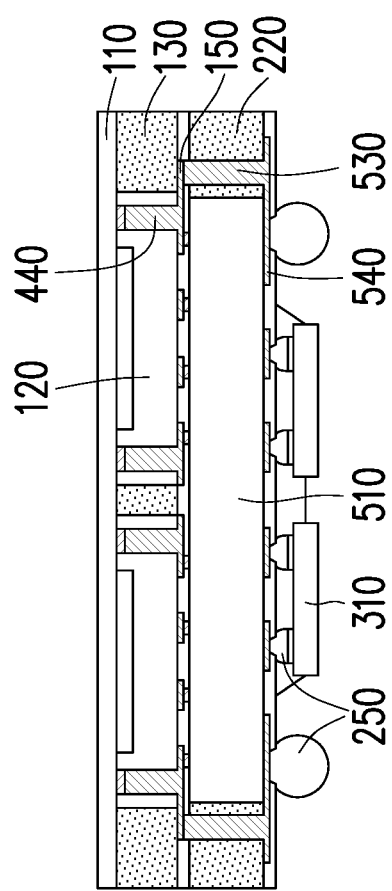

Referring to FIG. 3C and FIG. 3D, after forming the second encapsulant 220, the second circuit structure 540 may be formed on the through molding vias 530 and the second back surface 514 of the second chip 510. For example, the second passivation layer P2' having a plurality of openings P2a' may be formed on the second encapsulant 220 and the second chip 510 and the openings P2a' exposes at least a portion of the through molding vias 530. Next, the second circuit structure 540 may be formed in the openings P2a' of the second passivation layer P2'. In an embodiment, the forming process of the second passivation layer P2' and the second circuit structure 540 may be performed multiple times to obtain the multi-layered circuitry as required by the circuit design. The topmost second passivation layer P2' may have openings P2a' exposing at least the portion of the topmost second circuit structure 540 for further electrical connection. After forming the second circuit structure 540, the subsequent manufacturing processes may be similar with the embodiments described in FIG. 1H to FIG. 1J, and the detailed descriptions are omitted. After performing the singulation process and removing the temporary carrier 50, the manufacturing process of a semiconductor package 200 is substantially completed as shown in FIG. 3D.

Based on the above, the insulator covering the first active surface of the first chip may protect the sensing area on the first active surface from being damage in the subsequent assembling processes. In addition, the distance between the insulator and the sensing area is minimized, thereby achieving improved sensing capabilities of the semiconductor package. The second active surface of the second chip faces towards the first back surface of the first chip. In addition, the first circuit structure and the through silicon vias are electrically connected between the first chip and the second chip. As a result, the semiconductor package may keep a short electrical conduction path from the first chip to the second chip in order to reduce signal propagation, lower capacitance, and achieve better circuit performance. Furthermore, the third chip having the conductive connectors faces towards the second back surface of the second chip and electrically connects to the first chip and the second chip through the first circuit structure and the second circuit structure. As such, the manufacturing method of the semiconductor package integrating the first chip, the second chip and the third chip may achieve better operating performances and greater manufacturability.

FIG. 4A to FIG. 4D are schematic cross-sectional views illustrating a manufacturing method of a semiconductor package according to an embodiment of the disclosure. FIG. 4E is a schematic top view illustrating a manufacturing method of a semiconductor package according to an embodiment of the disclosure. For example, FIG. 4E may be a schematic top view of the structure of FIG. 4A.

Referring to FIGS. 4A and 4E, a permanent carrier 53 may be provided. The permanent carrier 53 may include a glass substrate, a wafer substrate, a metal substrate, a laminated substrate, or other suitable substrate material as long as the material is able to withstand the subsequent processes while carrying the package formed thereon.

In the embodiment, a plurality of insulators 411 may be formed on the permanent carrier 53. The insulator 411 has at least one opening 412. The amount of the insulators 411 in FIG. 4A or 4E merely serves as an exemplary illustration and the disclosure is not limited thereto. In an embodiment, the insulator 411 may be referred to a dam structure.

In the embodiment, the insulators 411 may be directly contact to the permanent carrier 53, but the disclosure is not limited thereto. In an embodiment not shown, an adhesive layer may be disposed between the insulators 411 and the permanent carrier 53.

In an embodiment, the material for forming insulators 411 may be epoxy, silicone, rubber, or other suitable insulating material, but the disclosure is not limited thereto.

Figure 4B:
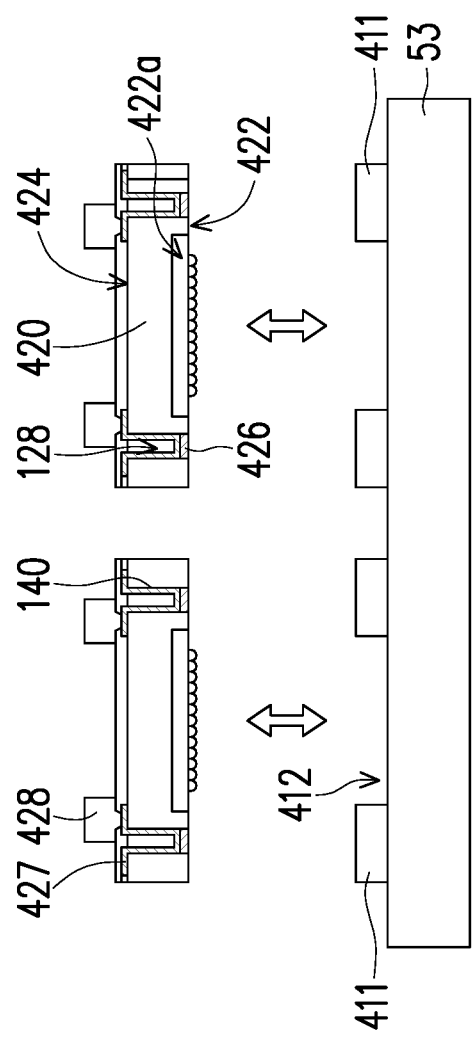

Referring to FIG. 4B, a plurality of first chips 420 may be disposed on the insulators 411. A plurality of through silicon vias 140, a first circuit structure 427, and a plurality of conductive pillars 428 may be disposed on each of the first chips 420.

In an embodiment, one of the first chips 420 may be disposed on the corresponding one of insulators 411, but the disclosure is not limited thereto.

In the embodiment, the first chip 420 is similar to the first chip 120. For example, the first chip 420 may include an active surface 422, a sensing area 422a on the active surface 422, a back surface 424 opposite to the active surface 422, and a plurality of through holes 128 extending from the back surface 424 towards the active surface 422.

In an embodiment, the first chip 420 may include a plurality of conductive pads 426 on the active surface 422 surrounding the sensing area 422a. For example, the first chip 420 may be disposed on the insulator 411 with the active surface 422 facing towards the insulator 411. In other words, the sensing area 422a and the conductive pads 426 on the active surface 422 of the first chip 420 may be covered by the insulator 411. The sensing area 422a of the first chip 420 corresponds to the opening 412 of the insulator 411. In other words, the sensing area 422a of the first chip 420, the opening 412 of the insulator 411, and the permanent carrier 53 may constitute a cavity 413 (as labelled in FIG. 4C).

Referring to FIG. 1C, FIG. 2B and FIG. 4B, a plurality of through silicon vias (TSVs) 140 may be formed in the through holes 128 of each of the first chip 420 to electrically connect to the conductive pads 426. The forming process of the through silicon vias 140 may be the same or similar to the forming process of the through silicon vias 140, and thus the forming process of the TSVs will not be described herein.

In the embodiment, the first circuit structure 427 may be disposed on the back surface 424 of each first chip 420. In an embodiment, the first circuit structure 427 may include a plurality of conductive layers, a plurality of insulating layers, and a plurality of conductive vias. A corresponding part of the conductive layer and/or a corresponding part of the conductive via may be formed a corresponding circuit. The corresponding circuit of the first circuit structure 427 may be electrically connected to the corresponding through silicon via 140. The first circuit structure 427 may be formed by a general semiconductor process, and thus will not be described herein.

In an embodiment, the first circuit structure 427 may be referred as a redistribution structure.

In an embodiment, the projected area of the first circuit structure 427 projected on the permanent carrier 53 is substantially equal to the projected area of the first chips 420 projected on the permanent carrier 53.

In the embodiment, a plurality of conductive pillars 428 may be disposed on the first circuit structure 427. The conductive pillar 428 may be electrically connected to the corresponding circuit of the first circuit structure 427.

Figure 4C:
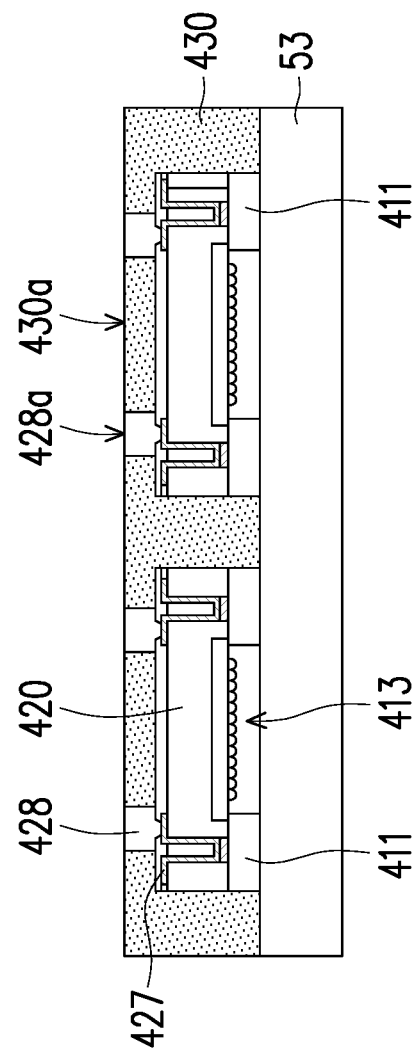

Referring to FIG. 4C, an encapsulant 430 may be formed on the permanent carrier 53 to laterally encapsulate the first chips 420, the first circuit structures 427, and the conductive pillars 428. The encapsulant 430 may be formed by a molding process (e.g., over-molding process). In an embodiment, the encapsulant 430 may be formed from an insulating material such as resin (e.g., epoxy) or other suitable insulating material.

In an embodiment, a thickness of the insulating material formed on the permanent carrier 53 may be cover the top surface 428a of the conductive pillars 428. In such case, the thickness of the insulating material formed on the permanent carrier 53 may be reduced to expose the top surface 428a of the conductive pillars 428 using, for example, a grinding process or other suitable process, to formed the encapsulant 430.

In the embodiment, the top surface 428a of the conductive pillars 428 may be coplanar with the top surface 430a of the encapsulant 430 facing away to the permanent carrier 53.

In the embodiment, the encapsulant 430 may laterally encapsulate the insulator 411.

Figure 4D:
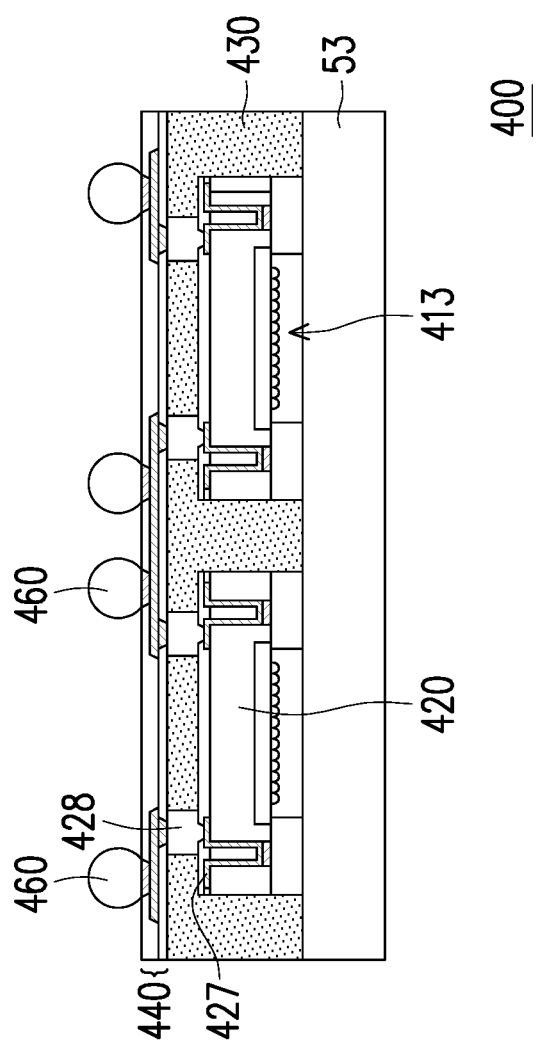
Figure 4E:
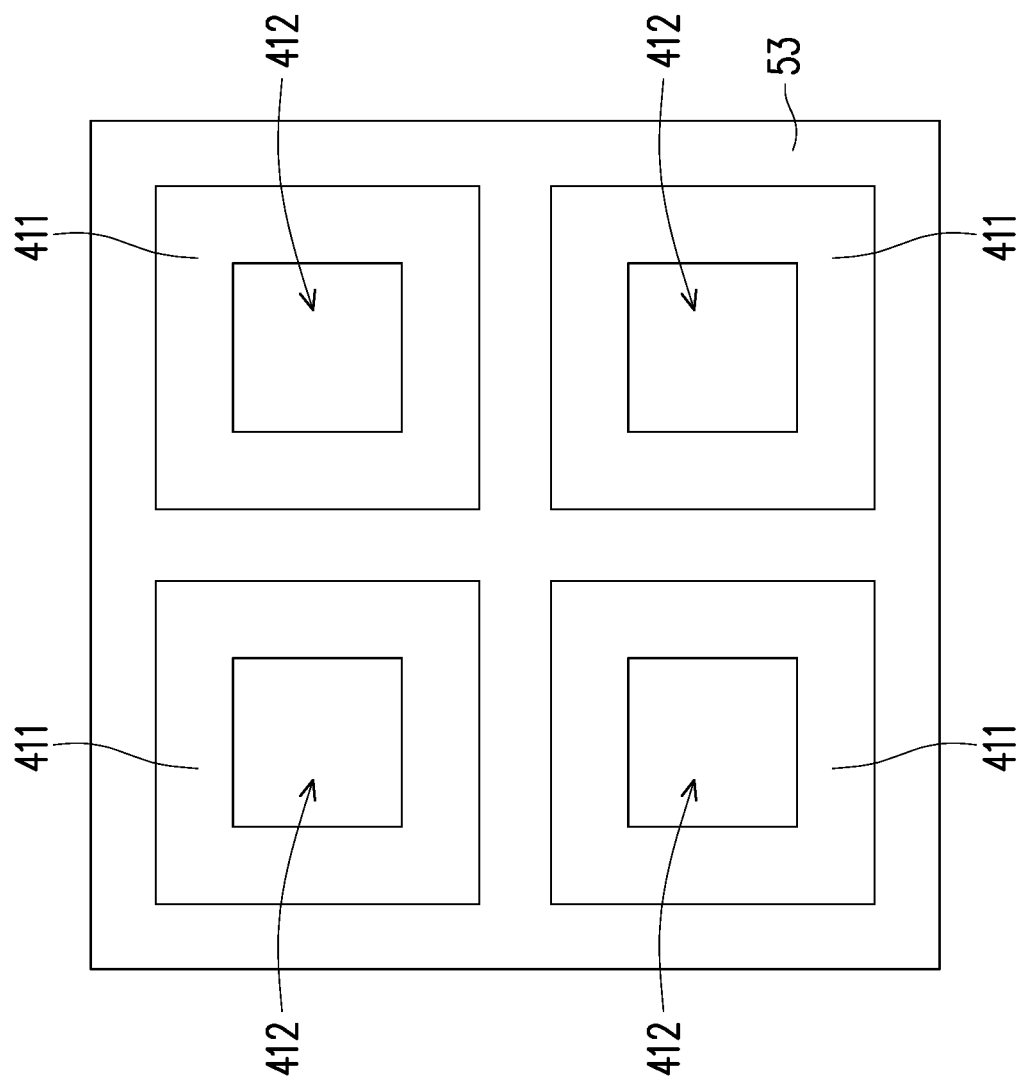
FIG. 4E is a schematic top view illustrating a manufacturing method of a semiconductor package according to an embodiment of the disclosure.

Referring to FIG. 4D, a second circuit structure 440 may be formed on the encapsulant 430. The corresponding circuit of the second circuit structure 440 may be electrically connected to the corresponding conductive pillar 428. The first chips 420 may be electrically connected to each other via the corresponding circuit of the second circuit structure 440. The second circuit structure 440 may be formed by a general semiconductor process, and thus will not be described herein.

In the embodiment, the projected area of the second circuit structure 440 projected on the permanent carrier 53 is larger than the projected area of the first chip 420 projected on the permanent carrier 53. In an embodiment, the second circuit structure 440 may be referred as a fan-out redistribution layer (FO RDL).

After forming the second circuit structure 440, a plurality of conductive features 460 may be formed on the second circuit structure 440. The forming process of the conductive features 460 may be the same or similar to the forming process of the conductive features 160, and thus the forming process of the conductive features will not be described herein.

After the above manufacturing process is performed, a semiconductor package 400 provided in the present embodiment are substantially formed.

Figure 5:
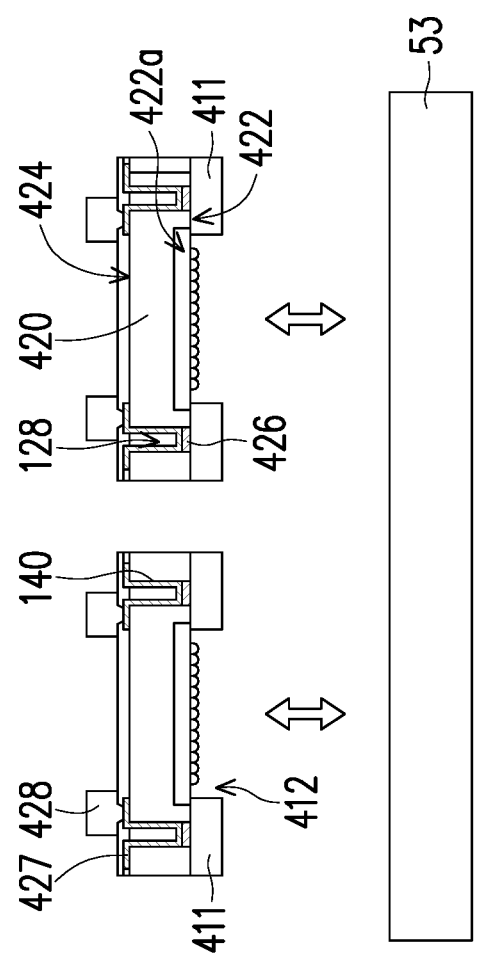
FIG. 5 is a schematic cross-sectional view illustrating a manufacturing method of a semiconductor package according to an embodiment of the disclosure.

FIG. 5 is a schematic cross-sectional view illustrating a manufacturing method of a semiconductor package according to an embodiment of the disclosure. The manufacturing method of the present embodiment is similar to the embodiment illustrated in FIG. 4A to FIG. 4E and the process descriptions may be omitted.

Referring to FIG. 5, before a first chip 420 is disposed on the permanent carrier 53, an insulator 411 may be disposed on the active surface 422 of the first chip 420. In other words, a first chip 420 with an insulator 411 thereon may be disposed on the permanent carrier 53.

After the insulators 411 and the first chips 420 being disposed on the permanent carrier 53, a semiconductor package may be provided in the present embodiment via the steps similar to FIG. 4C-4D.

FIG. 6A to FIG. 6D are schematic cross-sectional views illustrating a manufacturing method of a semiconductor package according to an embodiment of the disclosure. FIG. 6E is a schematic top view illustrating a manufacturing method of a semiconductor package according to an embodiment of the disclosure. For example, FIG. 6E may be a schematic top view of the structure of FIG. 6A. The manufacturing method of the present embodiment is similar to the embodiment illustrated in FIG. 4A to FIG. 4E and the process descriptions may be omitted.

Figure 6A:
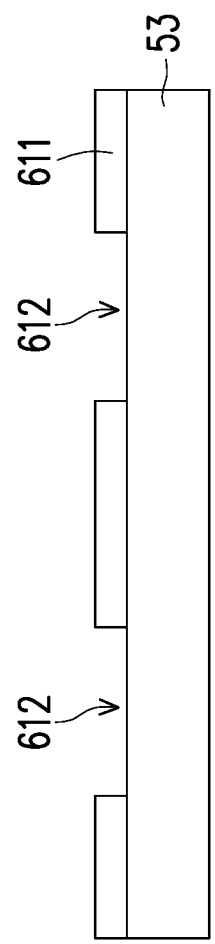
FIG. 6A to FIG. 6D are schematic cross-sectional views illustrating a manufacturing method of a semiconductor package according to an embodiment of the disclosure.
Figure 6B:
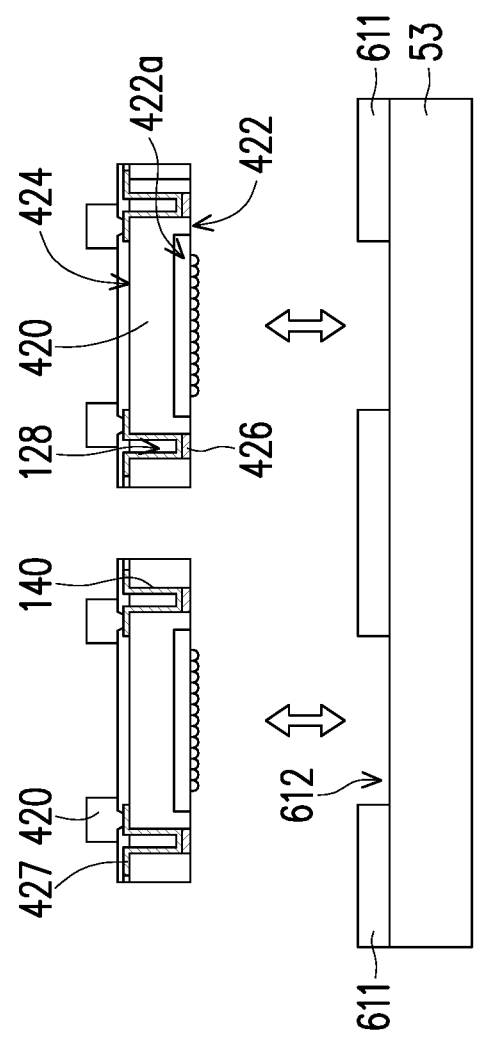
Figure 6C:
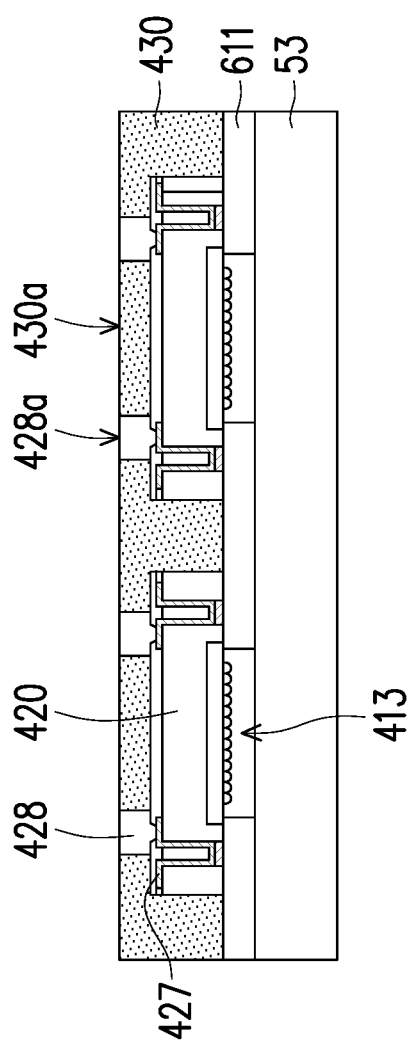
Figure 6D:
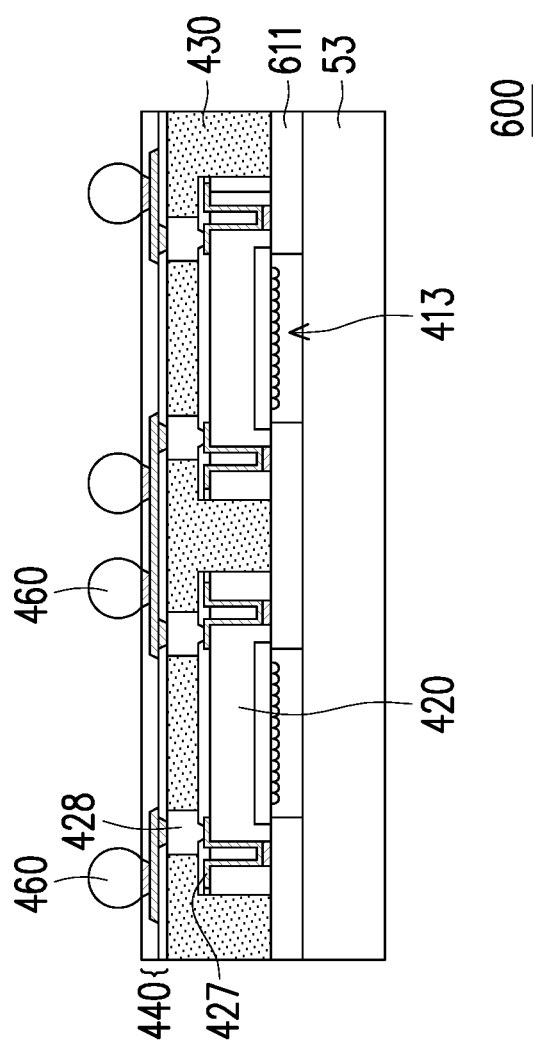
Figure 6E:
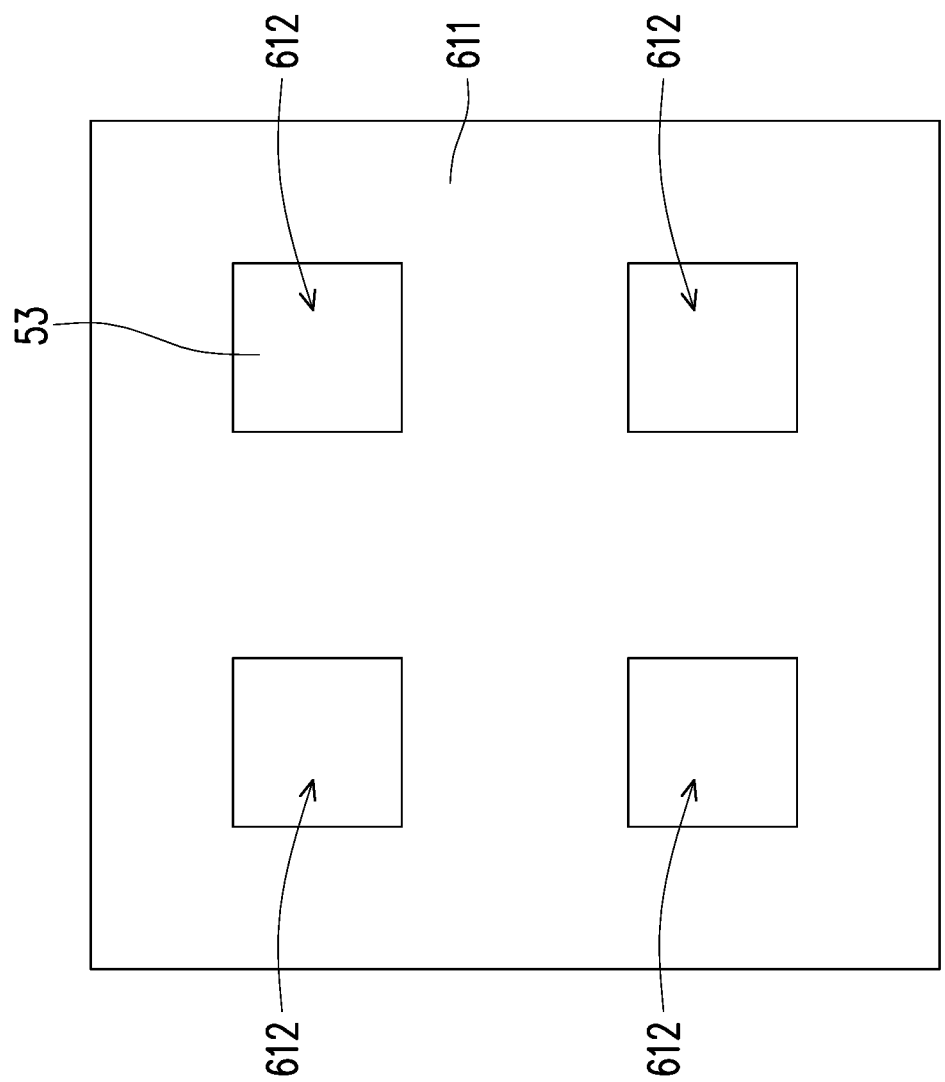
FIG. 6E is a schematic top view illustrating a manufacturing method of a semiconductor package according to an embodiment of the disclosure.

Referring to FIGS. 6A and 6E, an insulator 611 may be formed on the permanent carrier 53. The insulator 611 has a plurality of opening 612. In an embodiment, the insulator 611 may be referred to a dam structure.

Referring to FIG. 6B, a plurality of first chips 420 may be disposed on the insulators 611. In an embodiment, more than one first chips 420 may be disposed on the corresponding one of insulators 611, but the disclosure is not limited thereto.

The sensing area 422a of the first chip 420 corresponds to the opening 612 of the insulator 611. In other words, the sensing area 422a of the first chips 420, the openings 612 of the insulator 611, and the permanent carrier 53 may constitute corresponding cavities 613.

In an embodiment, the insulator 611 may further have a plurality of microchannel. The microchannel may be formed by a groove on a surface (e.g., a surface facing to the permanent carrier 53) of the insulator 611, but the disclosure is not limited thereto. The microchannel may connect the corresponding cavities 613.

Referring to FIGS. 6C-6D, after first chips 420 being disposed on the permanent carrier 53, a semiconductor package 600 (as labelled in FIG. 6D) may be provided in the present embodiment via the steps similar to FIGS. 4C-4D.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a semiconductor package, comprising:
    providing a plurality of first chips, each of the first chips comprising a first active surface, a sensing area on the first active surface, a first back surface opposite to the first active surface and a plurality of through holes extending from the first back surface towards the first active surface;
    forming a plurality of through silicon vias in the through holes of the first chip;
    forming a first circuit structure on the first back surface of the first chip to electrically connect the through silicon vias;
    providing a carrier;
    providing at least one insulator;
    bonding the carrier, the insulator, and the first chips with the through silicon vias and the first circuit structure, wherein the insulator is disposed between the carrier and the first chips, the first active surfaces of the first chips facing towards the insulator, and the first chips disposed on the carrier are physically separated from each other;
    forming a first encapsulant on the carrier, wherein the first encapsulant laterally encapsulates the first chips; and
    forming a second circuit structure on the first encapsulant, wherein the second circuit structure is electrically connected to the first circuit structure,
    wherein a portion of the first encapsulant is disposed between the first circuit structure and the second circuit structure,
    wherein a projected area of the first circuit structure projected on the carrier is substantially equal to a projected area of the first chips projected on the carrier, and a projected area of the second circuit structure projected on the carrier is larger than the projected area of the first chips projected on the carrier.

2. The manufacturing method according to claim 1, wherein the first chips comprise a first sensor chip and a second sensor chip, a photosensitive material included in the sensing area of the first sensor chip is different form a photosensitive material included in the sensing area of the second sensor chip.

3. The manufacturing method according to claim 1, wherein the first encapsulant further laterally encapsulate the first circuit structure.

4. A manufacturing method of a semiconductor package, comprising:
    providing a plurality of first chips, each of the first chips comprising a first active surface, a sensing area on the first active surface, a first back surface opposite to the first active surface and a plurality of through holes extending from the first back surface towards the first active surface;
    forming a plurality of through silicon vias in the through holes of the first chip;
    forming a first circuit structure on the first back surface of the first chip to electrically connect the through silicon vias;
    providing a carrier;
    providing at least one insulator;
    bonding the carrier, the insulator, and the first chips with the through silicon vias and the first circuit structure, wherein the insulator is disposed between the carrier and the first chips, the first active surfaces of the first chips facing towards the insulator, and the first chips disposed on the carrier are physically separated from each other;
    forming a first encapsulant on the carrier, wherein the first encapsulant laterally encapsulates the first chips; and
    forming a second circuit structure on the first encapsulant, wherein after forming the second circuit structure, the first chips are electrically connected to each other through the second circuit structure.

5. The manufacturing method according to claim 4, wherein the first chips comprise a first sensor chip and a second sensor chip, a photosensitive material included in the sensing area of the first sensor chip is different form a photosensitive material included in the sensing area of the second sensor chip.

6. The manufacturing method according to claim 4, wherein the first encapsulant further laterally encapsulate the first circuit structure.

7. A semiconductor package, comprising:
    a plurality of first chips, each of the first chips comprising a first active surface, a sensing area on the first active surface, a first back surface opposite to the first active surface and a plurality of through holes extending from the first back surface towards the first active surface;

a plurality of through silicon vias, disposed in the through holes of the first chips and electrically connected to the first chips;

at least one insulator, disposed on the first active surfaces of the first chips;

a first circuit structure, disposed on the first back surfaces of the first chips and electrically connected to the through silicon vias;

a first encapsulant, laterally encapsulating the first chips; and a second circuit structure, electrically connected to the first circuit structure, wherein a portion of the first encapsulant is disposed between the first circuit structure and the second circuit structure, wherein a projected area of the first circuit structure projected on the permanent carrier is substantially equal to a projected area of the first chips projected on the permanent carrier, and a projected area of the second circuit structure projected on the permanent carrier is larger than the projected area of the first chips projected on the permanent carrier.

8. The semiconductor package according to claim 7, wherein the first chips comprise a first sensor chip and a second sensor chip, a photosensitive material included in the sensing area of the first sensor chip is different form a photosensitive material included in the sensing area of the second sensor chip.

9. The semiconductor package according to claim 7, wherein the first encapsulant further laterally encapsulate the insulator.

10. The semiconductor package according to claim 7, further comprising:

a permanent carrier, wherein the insulator is disposed between the permanent carrier and the first chips.

11. The semiconductor package according to claim 7, wherein the first encapsulant further laterally encapsulate the first circuit structure.

12. The semiconductor package according to claim 7, further comprising:

only one second chip, disposed on the first circuit structure and comprising a second active surface facing towards the first back surfaces of the first chips, wherein the second chip is electrically connected to the first chips through the first circuit structure.

13. The semiconductor package according to claim 7, wherein the first encapsulant is disposed on the insulator.

* * * * *